United States Patent [19]

Sethi

[11] Patent Number: 5,432,749

[45] Date of Patent: Jul. 11, 1995

[54] NON-VOLATILE MEMORY CELL HAVING HOLE CONFINEMENT LAYER FOR REDUCING BAND-TO-BAND TUNNELING

[75] Inventor: Rakesh B. Sethi, Campbell, Calif.

[73] Assignee: National Semiconductor Corporation, Santa Clara, Calif.

[21] Appl. No.: 233,057

[22] Filed: Apr. 26, 1994

[51] Int. Cl.⁶ .............................................. G11C 16/00
[52] U.S. Cl. ................................. 365/218; 365/185; 257/315
[58] Field of Search ............... 365/218, 185, 900, 204; 257/315, 317, 320, 321; 437/43

[56] References Cited

U.S. PATENT DOCUMENTS

| Re. 31,083 | 11/1982 | DeKeersmaecker et al. | 257/325 |
|---|---|---|---|
| 4,104,675 | 8/1978 | DiMaria et al. | 257/325 |
| 4,330,850 | 5/1982 | Jacobs et al. | 365/185 |
| 4,458,407 | 7/1984 | Hoeg, Jr. et al. | 437/52 |
| 4,471,471 | 9/1984 | DiMaria | 365/149 |
| 4,958,321 | 9/1990 | Chang | 365/185 |
| 4,996,571 | 2/1991 | Kume et al. | 365/185 |
| 4,998,220 | 3/1991 | Eitan et al. | 365/185 |
| 5,034,798 | 7/1991 | Ohsima | 257/324 |
| 5,042,009 | 8/1991 | Kazerounian | 365/185 |
| 5,091,882 | 2/1992 | Naruke | 365/185 |
| 5,138,410 | 8/1992 | Takebuchi | 257/314 |
| 5,162,880 | 11/1992 | Hazama et al. | 257/106 |
| 5,235,544 | 8/1993 | Caywood | 365/185 |
| 5,255,237 | 10/1993 | Kodama | 365/218 |
| 5,262,985 | 11/1993 | Wada | 365/185 |
| 5,262,987 | 11/1993 | Kojima | 365/185 |
| 5,278,440 | 1/1994 | Shimoji | 257/324 |
| 5,298,447 | 3/1994 | Hong | 437/43 |
| 5,331,189 | 7/1994 | Chan et al. | 257/321 |

*Primary Examiner*—David C. Nelms
*Assistant Examiner*—Andrew Q. Tran
*Attorney, Agent, or Firm*—Hickman & Beyer

[57] ABSTRACT

An arrangement for reducing the erratic operation of a non-volatile memory cell caused by the accumulation of holes at a specific location within the cell during the electrical erasing of the cell includes a layer of hole confinement material positioned at the specific location the holes accumulate for containing the holes in a specific area. The arrangement also includes an arrangement for removing the holes from the containment area. A method of reducing the erratic operation of a non-volatile memory cell caused by the accumulation of holes at a specific location within the cell during the electrical erasing of the cell includes the step of providing a layer of hole confinement material positioned at the specific location the holes accumulate for containing the holes in the layer of hole confinement material.

13 Claims, 3 Drawing Sheets

NON-VOLATILE MEMORY CELL HAVING HOLE CONFINEMENT LAYER FOR REDUCING BAND-TO-BAND TUNNELING

BACKGROUND OF THE INVENTION

The present invention relates generally to non-volatile memory cells and more specifically to a technique for reducing the erratic operation of such cells caused by the build up of holes at specific locations during the operation of the cells.

FIG. 1 illustrates a typical prior art non-volatile memory cell generally designated by reference numeral 10. Memory cell 10 includes a silicon substrate 12 containing a doubly diffused source 14 and a drain 16. Substrate 12 supports a tunnel oxide layer 18, a floating gate 20, an ONO dielectric layer 22, and a gate 24. Memory cell 10 also includes an electrical lead 26 connected to drain 16, an electrical lead 28 connected to gate 24, and an electrical lead 30 connected to source 14. These leads are used for programming and erasing the memory cell. The particular prior art memory cell 10 shown in FIG. 1 is turned on by applying 6V to drain 16, 12V to gate 24, and grounding source 14 through their respective leads. The memory cell is erased by applying 12V to source 14 and grounding both drain 16 and gate 24, again through their respective leads.

During the electrical erasing process, prior art memory cells are known to have the problem of band to band tunneling which is the build up of holes at a particular location within the cell, specifically underneath tunnel oxide layer 18 at the junction between the source 14 and the tunnel oxide layer. FIG. 2 is an energy diagram of the prior art memory cell shown in FIG. 1. This energy diagram illustrates the flow of electrons from the floating gate into the source as the memory cell is being electrically erased. At the same time holes are counter injected from the source into the tunnel oxide and build up within the tunnel oxide along the junction with the source. This build up of holes erratically changes the threshold voltage of each cell within an array of memory cells which causes a wide threshold voltage distribution among the memory cells making up the array. The threshold voltage of a cell is the minimum voltage required for the cell to be conductive from source 14 to drain 16. This wide threshold voltage distribution among the memory cells making up the array makes it difficult to determine whether the cells have been erased properly and this problem is referred to as an erratic erase problem.

Several arrangements have been proposed which attempt to reduce the erratic erase problem described above including using graded source/drain junctions as illustrated in FIG. 1. This arrangement uses a doubly diffused source, or a deep source, to allow a larger voltage of 12V to be used during the electrical erasing of the cell. Using the graded source/drain and the 12V during the erasing reduces but does not solve the erratic erase problem. Because of the light and deep source, this approach also limits the ability to physically scale down this arrangement beyond a certain point. Some of the other arrangements which attempt to reduce the erratic erase problem include graded gate oxides, lightly doped drains in combination with negative gate erase, double Fowler-Nordhiem injection, and an algorithmic approach to self-convergence. Although these approaches are currently being used, they still are susceptible to the erratic erase problem. They also may create other problems such as reduced durability or increased complexity and expense of manufacture. The present invention provides a more reliable approach to solving this erratic erase problem.

SUMMARY OF THE INVENTION

As will be described in more detail hereinafter, a technique is disclosed herein for reducing the erratic operation of a non-volatile memory cell caused by the accumulation of holes at a particular location within the cell during the electrical erasing of the cell. In accordance with the present invention, this technique includes means for confining the holes in a specific area and means for removing the holes from the confinement area.

In one embodiment of the invention, the memory cell includes a silicon substrate which contains a source and which supports a layer of tunnel oxide. The means for confining the holes includes a layer of hole confinement material positioned between the source and the tunnel oxide layer. The means for removing the holes includes an electrical lead connected to the hole confinement layer wherein the lead is electrically connected to a negative voltage or ground after the electrical erasing of the cell thereby removing the holes.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

Figure 1:
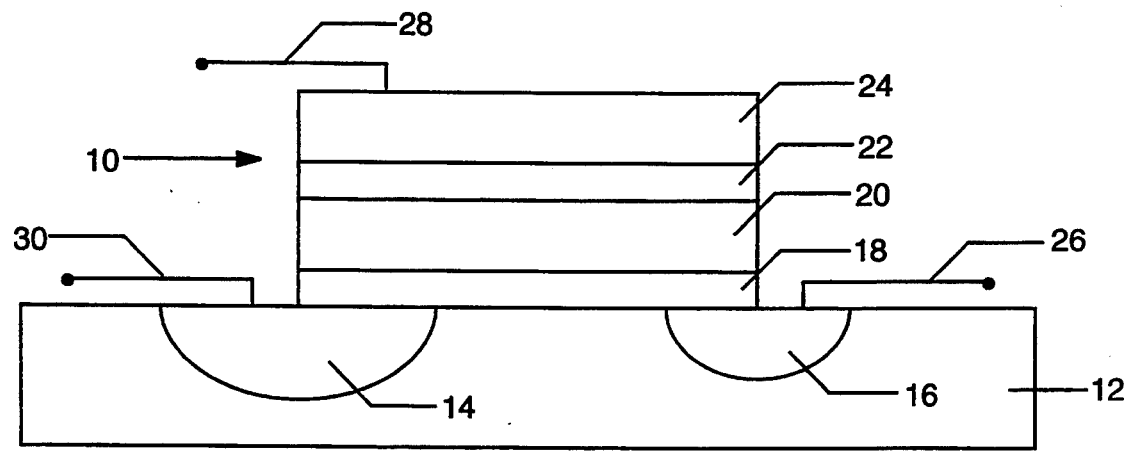
FIG. 1 is a diagrammatic cross sectional view of a prior art graded source/drain junction, non-volatile memory cell.
Figure 2:
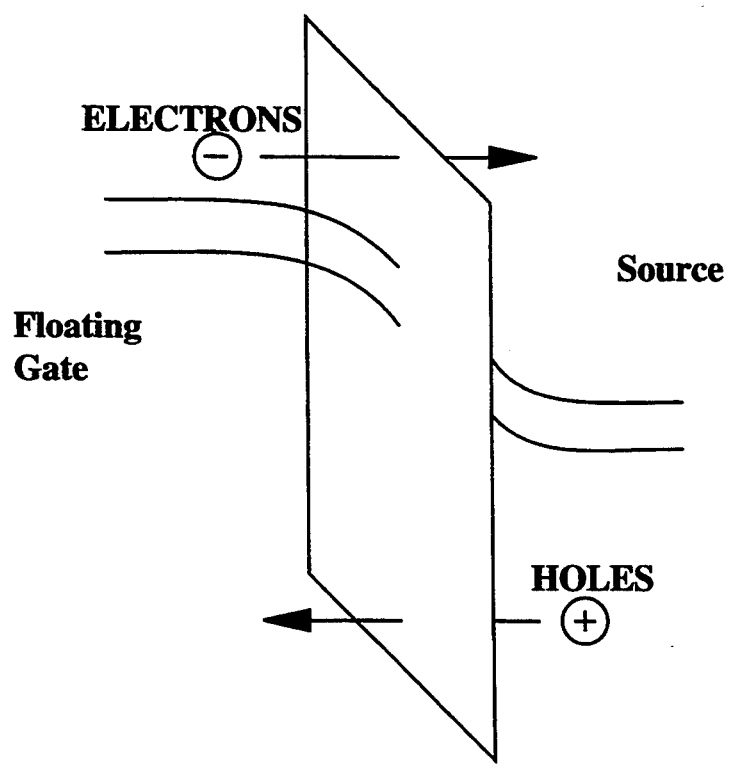
FIG. 2 is an energy diagram illustrating the flow of electrons and the counter injection of holes at the junction of the tunnel oxide layer and the source of the memory cell shown in FIG. 1.
Figure 3:
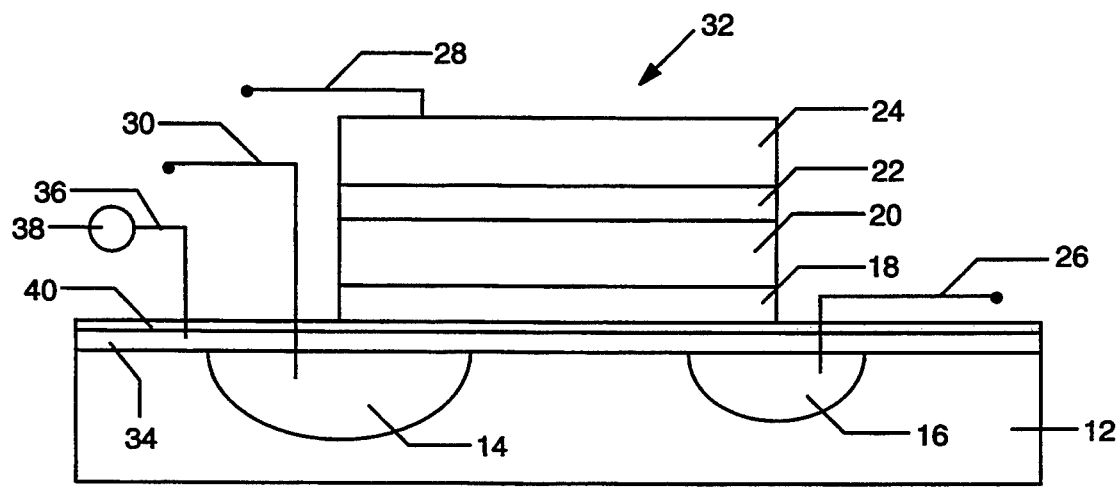
FIG. 3 is a diagrammatic cross sectional view of a first embodiment of a nonvolatile memory cell in accordance with the present invention.

Inasmuch as FIGS. 1 and 2 were discussed previously, attention is directed to FIGS. 3 and 4 which illustrate a non-volatile memory cell designed in accordance with the present invention and generally designated by reference numeral 32. As was described for the prior art memory cell shown in FIG. 1 and as shown in FIG. 3, memory cell 32 includes a silicon substrate 12 containing a doubly diffused source 14 and a drain 16. Substrate 12 supports a tunnel oxide layer 18, a floating gate 20, an ONO dielectric layer 22, and a gate 24. Memory cell 32 also includes an electrical lead 26 connected to drain 16, an electrical lead 28 connected to gate 24, and an electrical lead 30 connected to source 14. However, in accordance with the present invention, memory cell 32 also includes a hole confinement layer 34 positioned between the source 14 and the tunnel oxide layer 18. Furthermore, an electrical lead 36 is connected to the hole confinement layer 34.

Hole confinement layer 34 is made up of a material which restricts the flow of, or confines, holes within the material. One example of such a material is an alloy including silicon and germanium in concentrations of approximately 0.6% silicon and 0.4% germanium. This material is known to exhibit the above described properties and has been used in unrelated applications such as P-MOSFETs. Although an alloy including silicon and germanium is given as one example of a hole confining material, it should be understood that the present invention is not limited to a hole confinement material of this type. Instead, the present invention applies to a memory cell which includes a hole confinement layer of any material which reduces the flow of holes from the source to the adjacent tunnel oxide layer. Some examples of such a material are semi-insulating polycrystalline silicon (SIPOS) and oxygen implanted silicon.

As was described previously for prior art memory cell 10, memory cell 32 is erased by applying 12V to source 14 and grounding both drain 16 and gate 24. However, during the electrical erasing of memory cell 32 hole confinement layer 34 confines all of the holes which are being counter injected from source 14 within layer 34. After the electrical erasing of the cell is complete, lead 36 is connected to a negative voltage 38 thereby removing the holes from hole confinement layer 34 so that the hole confinement layer is ready to confine new holes during the next cycle. This arrangement significantly reduces the erratic operation of the memory cell by removing the holes which, as described for the prior art memory cell, would erratically change the threshold voltage of each cell within an array of memory cells and create a wide threshold voltage distribution among the cells within the array. Because the holes are removed, the threshold voltage distribution among the memory cells making up the array falls within a much narrower range. This narrower threshold voltage distribution makes it easier to determine whether the cells have been erased properly and therefore significantly reduces the erratic erase problem.

Figure 4:
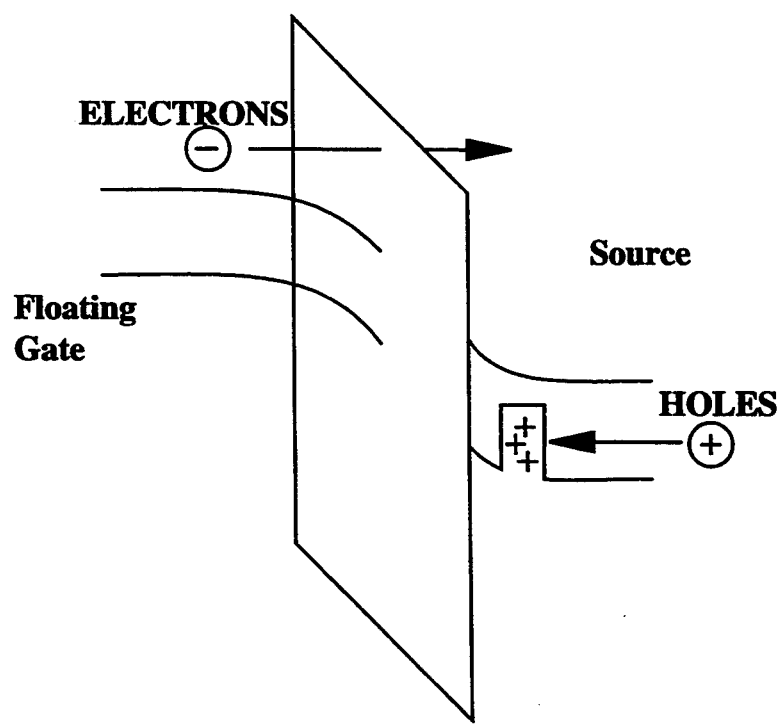
FIG. 4 is an energy diagram illustrating the flow of electrons and the containment of holes at the junction of the tunnel oxide layer and the source of the memory cell shown in FIG. 3.

FIG. 4 is an energy diagram of the memory cell shown in FIG. 3. This energy diagram illustrates the flow of electrons from the floating gate into the source as the memory cell is being electrically erased. At the same time, holes are being confined within the hole confinement layer as they are being counter injected from the source. After the erasing process is complete, the holes are removed by electrically connecting the hole confinement layer to a negative voltage or ground.

Figure 5:
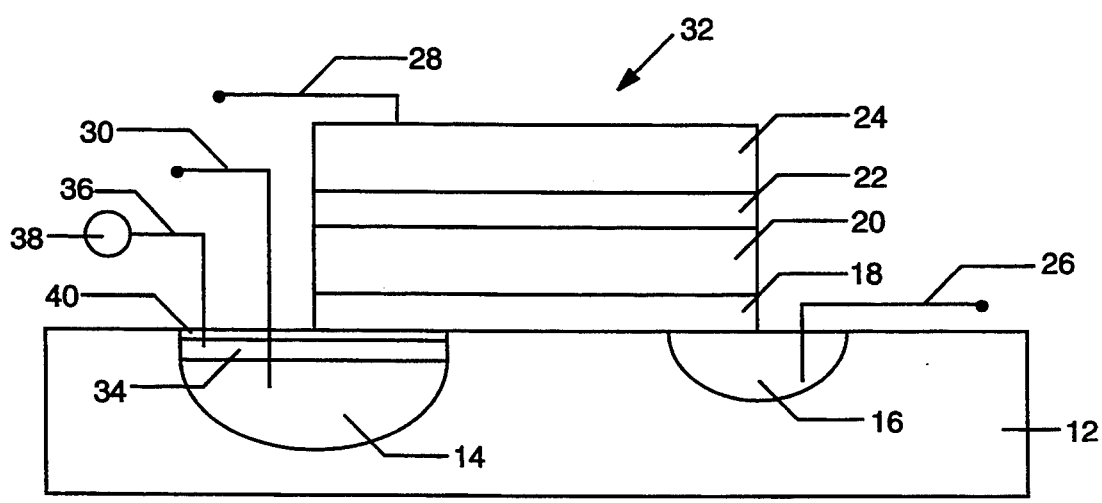
FIG. 5 is a diagrammatic cross sectional view of a second embodiment of a non-volatile memory cell in accordance with the present invention.

Referring now to FIG. 5, an alternative embodiment of the present invention will be described. In the embodiment previously described and shown in FIG. 3, the hole confinement layer covers the entire substrate. Alternatively, as shown in FIG. 5, hole layer 34 covers only the area of substrate 12 which supports source 14. It should be understood that these two embodiments are only two examples of the specific placement of the hole confinement layer. This layer may take a wide variety of forms depending on the manufacturing process and the requirements of the application.

Referring back to FIG. 3, a cap layer 40 may be deposited over hole confinement layer 34. This cap layer 40 mechanically holds hole confinement layer 34 in place. Example of materials which may be used as a cap layer are a deposited silicon (epitaxial) layer or a sputtered silicon layer. As mentioned above for the hole confinement layer, cap layer 40 may take a wide variety of shapes depending on the manufacturing process and the requirements of the application. Also, it should be understood that although only one example of a cap layer has been given, the present invention would apply to a cap layer made from any material which mechanically holds the hole confinement material in place while not interfering with the operation of the cell.

Although only twos embodiment of the present invention have been described, it should be understood that the present invention may be embodied in many other specific forms without departing from the spirit or scope of the invention. Particularly, the present invention is not limited to the specific style of memory cells illustrated in the above examples. Instead, the present invention applies to any non-volatile memory cell which tends to have a build up of holes at a specific location within the cell at certain times during it's operation which causes the cell to operate erratically.

Therefore, the present examples are to be considered as illustrative and not restrictive, and the invention is not to be limited to the details given herein, but may be modified within the scope of the appended claims.

What is claimed is:

1. In an electrically erasable non-volatile memory cell in which, during the electrical erasing of said cell, holes tend to accumulate at a specific location within said cell in a way which causes said cell to have a widely varying threshold voltage caused by the accumulation of holes at said specific location, an arrangement for reducing the variation of said threshold voltage, said arrangement comprising means for preventing said holes from accumulating at said specific location during the electrical erasing of the cell by confining said holes in a hole confinement area and means for removing said holes from said confinement area after the electrical erasing of the cell.

2. A memory cell according to claim 1 wherein;
  (a) said memory cell includes a silicon substrate having a source formed within said substrate and said substrate supports a layer of tunnel oxide,
  (b) said means for confining said holes comprises a hole confinement layer of hole confinement material positioned between said source and said tunnel oxide layer, and
  (c) said means for removing said holes includes electrically connecting said hole confinement layer to a negative voltage or ground voltage thereby removing said holes.

3. A memory cell according to claim 2 wherein said hole confinement layer is an alloy including silicon and germanium.

4. A memory cell according to claim 2 wherein said hole confinement layer includes a cap layer which mechanically holds said hole confinement layer in place.

5. A memory cell according to claim 2 wherein said hole confinement layer covers all of said silicon substrate.

6. A memory cell according to claim 2 wherein said hole confinement layer covers only said source formed within said silicon substrate.

7. In an electrically erasable non-volatile memory cell in which, during the electrical erasing of said cell, holes tend to accumulate at a specific location within said cell in a way which causes said cell to have a widely varying threshold voltage caused by the accumulation of holes at said specific location, a method of reducing the variation of said threshold voltage, said method comprising the steps of;
(a) preventing said holes from accumulating at said specific location during the electrical erasing of the cell by confining said holes within a hole confinement area so that said holes do not reach said specific location, and
(b) periodically removing said holes from said confinement area.

8. A method according to claim 7 wherein;
(a) said memory cell includes a silicon substrate having a source formed within said substrate and said substrate supports a layer of tunnel oxide,
(b) said step of confining said holes includes the step of confining said holes within a hole confinement layer of hole confinement material deposited between said source and said tunnel oxide layer, and
(c) said step of periodically removing said holes includes the step of electrically connecting said hole confinement layer to a negative voltage or ground voltage.

9. A method according to claim 8 wherein said hole confinement layer is an alloy including silicon and germanium.

10. A method according to claim 8 further comprising the step of holding said hole confinement layer in place.

11. A method according to claim 10 wherein the step of holding said hole confinement layer in place includes the step of depositing a cap layer over said hole confinement layer wherein said cap layer mechanically holds said hole confinement layer in place.

12. A method according to claim 8 wherein said hole confinement layer covers all of said silicon substrate.

13. A method according to claim 8 wherein said hole confinement layer covers only said source formed within said silicon substrate.

* * * * *